(12) United States Patent
Goto

(10) Patent No.: US 6,850,547 B2
(45) Date of Patent: Feb. 1, 2005

(54) NITRIDE BASED SEMICONDUCTOR LASER DEVICE AND METHOD OF FABRICATING THE SAME

(75) Inventor: Takenori Goto, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 24 days.

(21) Appl. No.: 09/888,419

(22) Filed: Jun. 26, 2001

(65) Prior Publication Data

US 2002/0001327 A1 Jan. 3, 2002

(30) Foreign Application Priority Data

Jun. 28, 2000 (JP) ........................................ 2000-194097

(51) Int. Cl.[7] .......................... H01L 27/15; H01L 33/00
(52) U.S. Cl. ........................ 372/43; 372/38.05; 372/75; 257/79; 257/99; 257/103; 257/615
(58) Field of Search .............................. 257/79, 99, 103, 257/615, 613; 372/43–45, 75, 38.05

(56) References Cited

U.S. PATENT DOCUMENTS

| | | | | |
|---|---|---|---|---|
| 5,727,008 A | * | 3/1998 | Koga | 372/43 |
| 5,900,647 A | * | 5/1999 | Inoguchi | 257/76 |
| 6,177,292 B1 | | 1/2001 | Hong et al. | |
| 6,215,803 B1 | * | 4/2001 | Hata | 372/46 |
| 6,410,939 B1 | * | 6/2002 | Koide et al. | 257/79 |

FOREIGN PATENT DOCUMENTS

| | | |
|---|---|---|
| JP | 6-79172 U | 11/1994 |
| JP | 11-284282 | 10/1999 |

* cited by examiner

*Primary Examiner*—Jerome Jackson
*Assistant Examiner*—Joseph Nguyen
(74) *Attorney, Agent, or Firm*—Westerman, Hattori, Daniels & Adrian, LLP

(57) ABSTRACT

A semiconductor laser device is constructed by stacking an n-cladding layer, an n-optical guide layer, an MQW active layer, a p-cap layer, a p-optical guide layer, a p-cladding layer, an n-current blocking layer, and a p-contact layer in this order on one surface of a transparent substrate. A p electrode is formed on a predetermined region of the p-contact layer. An n electrode having a projected shape is formed on the other surface of the transparent substrate. In this case, a portion, where a projection of the n electrode is arranged, of the device corresponds to the front (a surface on the side of laser light emission) thereof.

31 Claims, 12 Drawing Sheets

F I G. 1
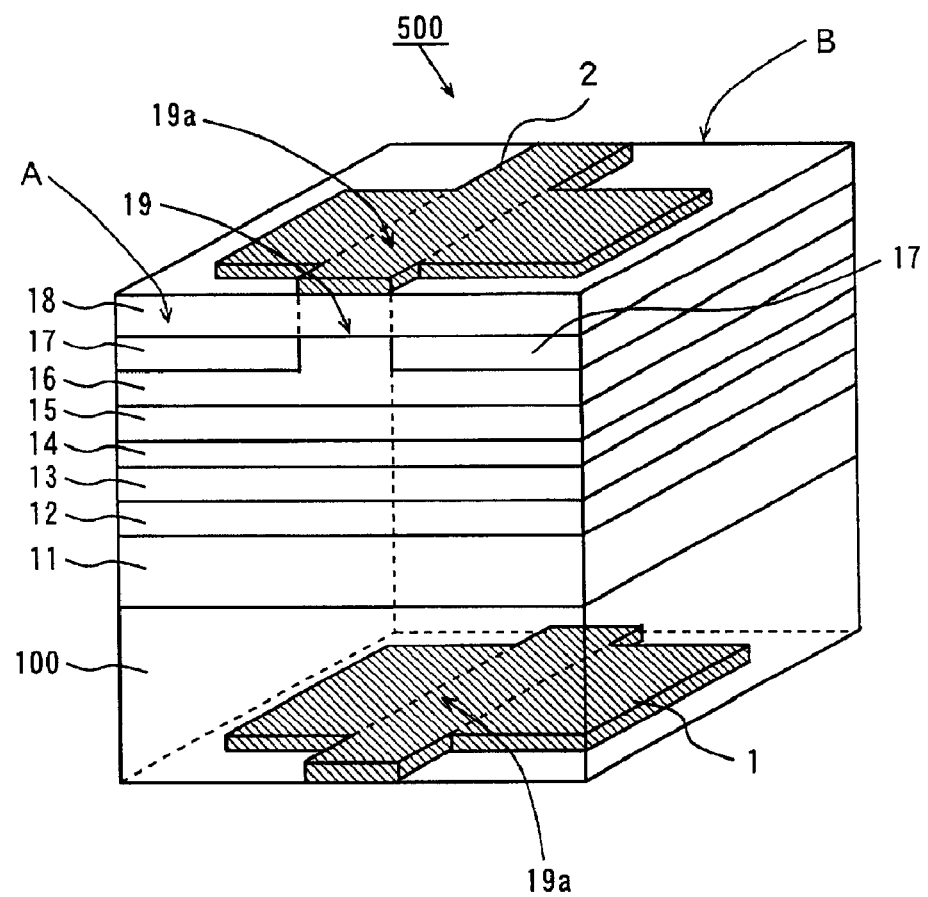

F I G. 5
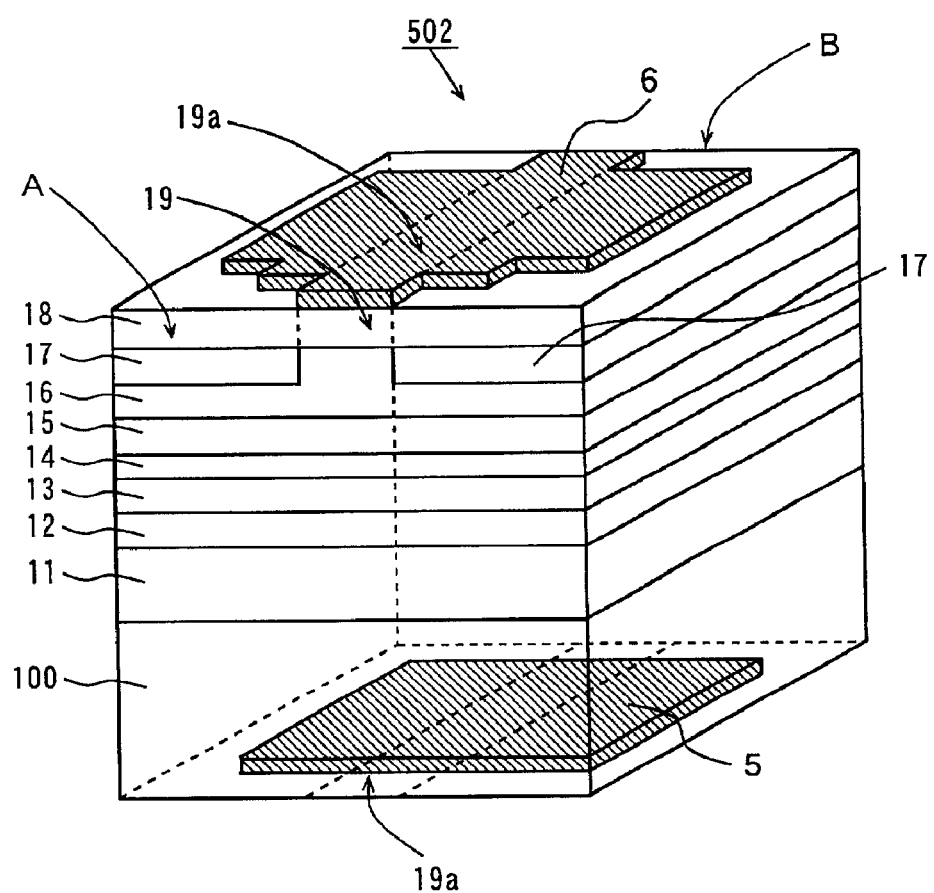

NITRIDE BASED SEMICONDUCTOR LASER DEVICE AND METHOD OF FABRICATING THE SAME

BACKGROUND OF THE INVENTION

1. Field of the Invention

The present invention relates to a nitride based semiconductor laser device fabricated using a transparent substrate having conductive properties composed of gallium nitride (GaN), silicon carbide (SiC), or the like and a method of fabricating the same.

In this case, a Group III-V nitride based semiconductor such as BN (boron nitride), GaN (gallium nitride), AlN (aluminum nitride), InN (indium nitride), or TlN (thallium nitride), or their mixed crystal is referred to as a nitride based semiconductor.

2. Description of the Background Art

FIG. 12 is a schematic perspective view showing the structure of a conventional GaN based semiconductor laser device constructed by forming a nitride based semiconductor layer on a transparent GaN substrate having conductive properties.

The semiconductor laser device shown in FIG. 12 is constructed by stacking an n-AlGaN cladding layer 52, an n-GaN optical guide layer 53, an MQW active layer 54, a P-GaN cap layer 55, a p-GaN optical guide layer 56, and a p-AlGaN cladding layer 57 in this order on a transparent GaN substrate 51 having conductive properties. A ridge portion 50 is formed on the p-AlGaN cladding layer 57. An n-AlGaN current blocking layer 58 is formed on a flat portion of the p-AlGaN cladding layer 57, and a p-GaN contact layer 59 is further formed on the n-AlGaN current blocking layer 58 and the p-AlGaN cladding layer 57 including the ridge portion 50.

An n electrode 60 is formed on the whole of an upper surface of the GaN substrate 51, and a p-electrode 61 is formed on a predetermined region of the p-GaN contact layer 59.

In such a semiconductor laser device, a dielectric film (not shown) composed of one layer or a plurality of layers is formed at both facets along its cavity length. The following are two purposes of forming such a dielectric film in the semiconductor laser device.

One of the purposes is to protect the facets along the cavity length of the semiconductor laser device. That is, the dielectric film is exerted as a facet protective film, thereby preventing each of the layers exposed at the facets along the cavity length from being oxidized.

The other purpose is to adjust the total number of layers composing the dielectric film and the thickness thereof to adjust the reflectance of the dielectric film at each of the facets along the cavity length of the semiconductor laser device. Consequently, desired device characteristics can be obtained in the semiconductor laser device.

For example, in the dielectric film formed at each of the facets along the cavity length, the number of layers composing the dielectric film and the thickness thereof are adjusted such that its reflectance at the facet on the side of laser light emission (hereinafter referred to as a front facet) is low and its reflectance at the facet on the opposite side thereof (hereinafter referred to as a rear facet) is high. Consequently, the amount of light emitted from the front facet can be increased, thereby increasing the output power of the semiconductor laser device.

As described in the foregoing, in the semiconductor laser device, dielectric films having different reflectances are respectively formed at the front facet and the rear facet. In a semiconductor laser apparatus using such a semiconductor laser device, the semiconductor laser device is arranged on a sub-mount or the like in correct forward and backward directions so as to be normally operated.

However, it is difficult to distinguish the forward and backward directions in the conventional semiconductor laser device, as shown in FIG. 12. Accordingly, it takes much time to distinguish the directions. In a semiconductor laser apparatus using such a semiconductor laser device, therefore, the yield in the assembling process is low, and the work efficiency in the assembling process is reduced. As a result, the fabrication efficiency of the semiconductor laser apparatus is reduced, and the fabrication cost thereof is raised.

SUMMARY OF THE INVENTION

An object of the present invention is to provide a nitride based semiconductor laser device capable of easily distinguishing forward and backward directions along its cavity length and a method of fabricating the same.

A nitride based semiconductor laser device according to an aspect of the present invention comprises a transparent substrate having conductive properties; a nitride based semiconductor layer formed on one surface of the transparent substrate and constituting a cavity; a first ohmic electrode of a first conduction type formed on the other surface of the transparent substrate; and a second ohmic electrode of a second conduction type formed on the nitride based semiconductor layer, at least one of the first and second ohmic electrodes being formed in such a shape or arrangement that the forward and backward directions along the cavity length of the nitride based semiconductor layer can be distinguished.

In the nitride based semiconductor laser device according to the present invention, at least one of the first and second ohmic electrodes is formed in such a shape or arrangement that the forward and backward directions along the cavity length of the nitride based semiconductor laser device can be distinguished. In the nitride based semiconductor laser device, therefore, it is possible to easily and accurately distinguish the forward and backward directions of the device along the cavity length on the basis of the shape or arrangement of at least one of the first and second ohmic electrodes.

In the nitride based semiconductor laser device in which both the first and second ohmic electrodes are formed in such a shape or arrangement that the front and the rear of the device can be distinguished, when the device is observed from the transparent substrate, the shape or arrangement of the first ohmic electrode can be directly confirmed. Consequently, in this case, it is possible to easily and accurately distinguish the forward and backward directions of the device on the basis of the shape or arrangement of the first ohmic electrode. When the device is observed from the nitride based semiconductor layer, the shape or arrangement of the second ohmic electrode can be directly confirmed. Consequently, in this case, it is possible to easily and accurately distinguish the forward and backward directions of the device on the basis of the shape or arrangement of the second ohmic electrode.

As described in the foregoing, in the nitride based semiconductor laser device in which both the first and second ohmic electrodes are formed in such a shape or arrangement that the forward and backward directions of the device can be distinguished, even when the device is observed from either the transparent substrate or the nitride based semiconductor layer, it is possible to easily and accurately distinguish the forward and backward directions of the device.

On the other hand, in the nitride based semiconductor laser device in which only the first ohmic electrode is formed in such a shape or arrangement that the forward and backward directions of the device can be distinguished, when the device is observed from the transparent substrate, the shape or arrangement of the first ohmic electrode can be directly confirmed. Consequently, in this case, it is possible to easily and accurately distinguish the forward and backward directions of the device on the basis of the shape or arrangement of the first ohmic electrode. When the device is observed from the nitride based semiconductor layer, the first ohmic electrode cannot be directly confirmed. However, the nitride based semiconductor layer and the transparent substrate are transparent. Accordingly, the first ohmic electrode formed on the opposite side (on the side of the transparent substrate) can be seen upon penetrating through the transparent substrate and the nitride based semiconductor layer. Even when the device is observed from the nitride based semiconductor layer, therefore, the shape or arrangement of the first ohmic electrode can be confirmed.

In the nitride based semiconductor device in which only the second ohmic electrode is formed in such a shape or arrangement that the forward and backward directions of the device can be distinguished, when the device is observed from the nitride based semiconductor, the shape or arrangement of the second ohmic electrode can be directly confirmed. Consequently, in this case, it is possible to easily and accurately distinguish the forward and backward directions of the device on the basis of the shape or arrangement of the second ohmic electrode. When the device is observed from the transparent substrate, the second ohmic electrode cannot be directly observed. However, the nitride based semiconductor layer and the transparent substrate are transparent. Accordingly, the second ohmic electrode formed on the opposite side (on the side of the nitride based semiconductor layer) can be seen upon penetrating through the transparent substrate and the nitride based semiconductor layer. Even when the device is observed from the transparent substrate, therefore, the shape or arrangement of the second ohmic electrode can be confirmed.

As described in the foregoing, in the nitride based semiconductor laser device in which only one of the first and second ohmic electrodes is formed in such a shape or arrangement that the forward and backward directions of the device can be distinguished, even when the device is observed from either the transparent substrate or the nitride based semiconductor layer, it is possible to easily and accurately distinguish the forward and backward directions of the device.

In a case where the nitride based semiconductor laser device according to the present invention is used for a semiconductor laser apparatus, it is possible to easily and accurately distinguish the forward and backward directions of the device, as described above. Accordingly, the device can be arranged in a correct direction, to assemble the apparatus. Therefore, the yield at the time of the assembling process of the semiconductor laser apparatus is improved. In this case, it does not take much time to distinguish the forward and backward directions of the device. Accordingly, the tact time in the assembling process of the semiconductor laser apparatus can be shortened, and the work efficiency in the assembling process is improved.

In the semiconductor laser device using the nitride based semiconductor laser device according to the present invention, the fabrication efficiency thereof is improved, and the fabrication cost thereof is reduced.

The first ohmic electrode and the second ohmic electrode may have different shapes. In this case, it is possible to easily and accurately distinguish the forward the backward directions of the device on the basis of the shape of at least one of the first and second ohmic electrodes. Further, the main surface and the reverse surface of the nitride based semiconductor laser device can be distinguished on the basis of the first and second ohmic electrodes. Consequently, the nitride based semiconductor laser device is used for the semiconductor laser apparatus, thereby further improving the fabrication efficiency of the semiconductor laser device as well as further reducing the fabrication cost thereof.

The first ohmic electrode and the second ohmic electrode may have the same shape. Further, the second ohmic electrode may be arranged on a region different from a region above a region where the first ohmic electrode is formed in the nitride based semiconductor layer. In this case, it is possible to easily and accurately distinguish the forward and backward directions on the basis of the shape of at least one of the first and second ohmic electrodes.

Particularly when the second ohmic electrode is arranged on the region different from the region above the region where the first ohmic electrode is formed in the nitride based semiconductor layer, the main surface and the reverse surface of the device can be further distinguished on the basis of the arrangements of the first and second ohmic electrodes. Consequently, the nitride based semiconductor laser device is used for the semiconductor laser apparatus, thereby further improving the fabrication efficiency of the semiconductor laser apparatus as well as further reducing the fabrication cost thereof.

The transparent substrate may be composed of gallium nitride or silicon carbide. Further, the nitride based semiconductor layer may contain at least one of gallium, aluminum, indium, boron, and thallium.

At least one of the first and second ohmic electrodes is asymmetric with respect to a line passing through a center point of the cavity length and vertical to the cavity length direction. In this case, at least one of the first ohmic electrode and the second ohmic electrode has different shapes ahead of and behind the device. Accordingly, it is possible to distinguish the forward and backward directions of the device on the basis of the shape of at least one of the first and second ohmic electrodes.

The nitride based semiconductor layer may have a striped current injection region, and the first and second ohmic electrodes may respectively have regions opposite to the striped current injection region. In this case, it is possible to sufficiently inject a current into the whole of the striped current injection region of the nitride based semiconductor layer.

The nitride based semiconductor laser device may further comprise dielectric films respectively formed at a front facet and a rear facet of the cavity. The dielectric films respectively formed at the front facet and the rear facet of the cavity may have different reflectances. Even in this case, it is possible to easily and accurately distinguish the front and the rear of the device.

The nitride based semiconductor layer may comprise a cladding layer of a first conduction type, an active layer, and a cladding layer of a second conduction type.

A method of fabricating a nitride based semiconductor laser device according to another aspect of the present invention comprises the steps of forming a nitride based semiconductor layer on a transparent substrate having conductive properties; forming a first ohmic electrode of a first conduction type on a predetermined region on the other surface of the transparent substrate, and forming a second ohmic electrode of a second conduction type on the nitride based semiconductor layer; and dividing the transparent substrate, together with the nitride based semiconductor layer, to form a front facet and a rear facet to form a cavity, the step of forming the first and second ohmic electrodes comprising the step of forming at least one of the first and second ohmic electrodes in such a shape or arrangement that the forward and backward directions along the cavity length can be distinguished.

In the method of fabricating the nitride based semiconductor laser device according to the present invention, in the electrode forming step, at least one of the first and second ohmic electrodes is formed in such a shape or arrangement that the forward and backward directions along the cavity length of the nitride based semiconductor laser device can be distinguished. Thereafter, the front facet and the rear facet are formed to form the cavity in accordance with the forward and backward directions along the cavity length based on the shape or arrangement of at least one of the first and second ohmic electrodes.

In the method of fabricating the nitride based semiconductor laser device, in the electrode forming step, at least one of the first and second ohmic electrodes is formed in such a shape or arrangement that the forward and backward directions along the cavity length of the nitride based semiconductor laser device can be distinguished. In the nitride based semiconductor laser device formed by such a method, it is possible to easily and accurately distinguish the forward and backward directions of the device along the cavity length on the basis of the shape or arrangement of at least one of the first and second ohmic electrodes.

According to the method, therefore, it is possible to form the nitride based semiconductor laser device capable of easily and accurately distinguishing the forward and backward directions of the device along the cavity length.

Even in a case where the nitride based semiconductor laser device formed by the above-mentioned method is used for a semiconductor laser apparatus, it is possible to easily and accurately distinguish the forward and backward directions of the device, as described above. Accordingly, the device is arranged in a correct direction, thereby making it possible to assemble the apparatus. Therefore, the yield at the time of the assembling process of the semiconductor laser apparatus is improved. In this case, it does not take much time to distinguish the forward and backward directions of the device. Accordingly, the tact time in the assembling process of the semiconductor laser apparatus can be shortened, and the work efficiency in the assembling process is improved.

According to the method of fabricating the nitride based semiconductor laser device, therefore, it is possible to improve the fabrication efficiency of the semiconductor laser device as well as to reduce the fabrication cost thereof.

The fabricating method may further comprise the step of respectively forming dielectric films at the front facet and the rear facet. In this case, the dielectric films having different reflectances are respectively formed at the front facet and the rear facet in the cavity length direction in accordance with the forward and backward directions along the cavity length based on the shape or arrangement of at least one of the first and second ohmic electrodes.

Thus in the method of fabricating the nitride based semiconductor laser device, in the dielectric film forming step, the dielectric films having different reflectances are respectively formed at the front facet and the rear facet in accordance with the forward and backward directions along the cavity length based on the shape or arrangement of at least one of the first and second ohmic electrodes. In the dielectric film forming step, therefore, the dielectric films having the most suitable reflectances can be respectively formed at the front facet and the rear facet at high efficiency and with a high yield.

The step of forming the first and second ohmic electrodes may comprise the step of forming the first ohmic electrode and the second ohmic electrode in different shapes. In the nitride based semiconductor laser device fabricated by such a method, it is possible to easily and accurately distinguish the forward and backward directions of the device on the basis of the shape of at least one of the first and second ohmic electrodes, and it is further possible to distinguish the main surface and the reverse surface of the nitride based semiconductor laser device on the basis of the shapes of the first and second ohmic electrodes. Consequently, the nitride based semiconductor laser device fabricated by such a method is used for the semiconductor laser apparatus, thereby further improving the fabrication efficiency of the semiconductor laser device as well as further reducing the fabrication cost thereof.

The step of forming the first and second ohmic electrodes may comprise the step of forming the first ohmic electrode and the second ohmic electrode in the same shape. Further, the step of forming the first and second ohmic electrodes may comprise the step of arranging the second ohmic electrode on a region different from a region above a region where the first ohmic electrode is formed in the nitride based semiconductor layer. In the nitride based semiconductor laser device fabricated by such a method, it is possible to easily and accurately distinguish the front and rear of the device on the basis of the shape of at least one of the first and second ohmic electrodes.

Particularly when the second ohmic electrode is arranged on the region different from the region above the region where the first ohmic electrode is formed in the nitride based semiconductor layer, it is possible to further distinguish the main surface and the reverse surface of the device on the basis of the arrangements of the first and second ohmic electrodes. Consequently, the nitride based semiconductor laser device fabricated by such a method is used for the semiconductor laser apparatus, thereby further improving the fabrication efficiency of the semiconductor laser device as well as further reducing the fabrication cost thereof.

The transparent substrate may be composed of gallium nitride or silicon carbide. The nitride based semiconductor layer may contain at least one of gallium, aluminum, indium, boron, and thallium.

The step of forming the first and second ohmic electrodes may comprise the step of arranging at least one of the first and second ohmic electrodes so as to be asymmetric with respect to a line passing through a center point of the cavity length and vertical to the cavity length direction. In this case, at least one of the first ohmic electrode and the second ohmic electrode has different shapes ahead of and behind the device. Consequently, it is possible to distinguish the forward and backward directions of the device on the basis of the shape of at least one of the first and second ohmic electrodes.

The nitride based semiconductor layer may have a striped current injection region, and the first and second ohmic electrodes may respectively have regions opposite to the striped current injection region. In this case, it is possible to sufficiently inject a current into the whole of the striped current injection region of the nitride based semiconductor layer.

The dielectric films respectively formed at the front facet and the rear facet of the cavity may have different reflectances. Even in this case, it is possible to easily and accurately distinguish the front and rear of the device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic perspective view showing a first example of a semiconductor laser device according to the present invention;

FIG. 5 is a schematic perspective view showing a third example of the semiconductor laser device according to the present invention;

DESCRIPTION OF THE PREFERRED EMBODIMENTS

Figure 2:
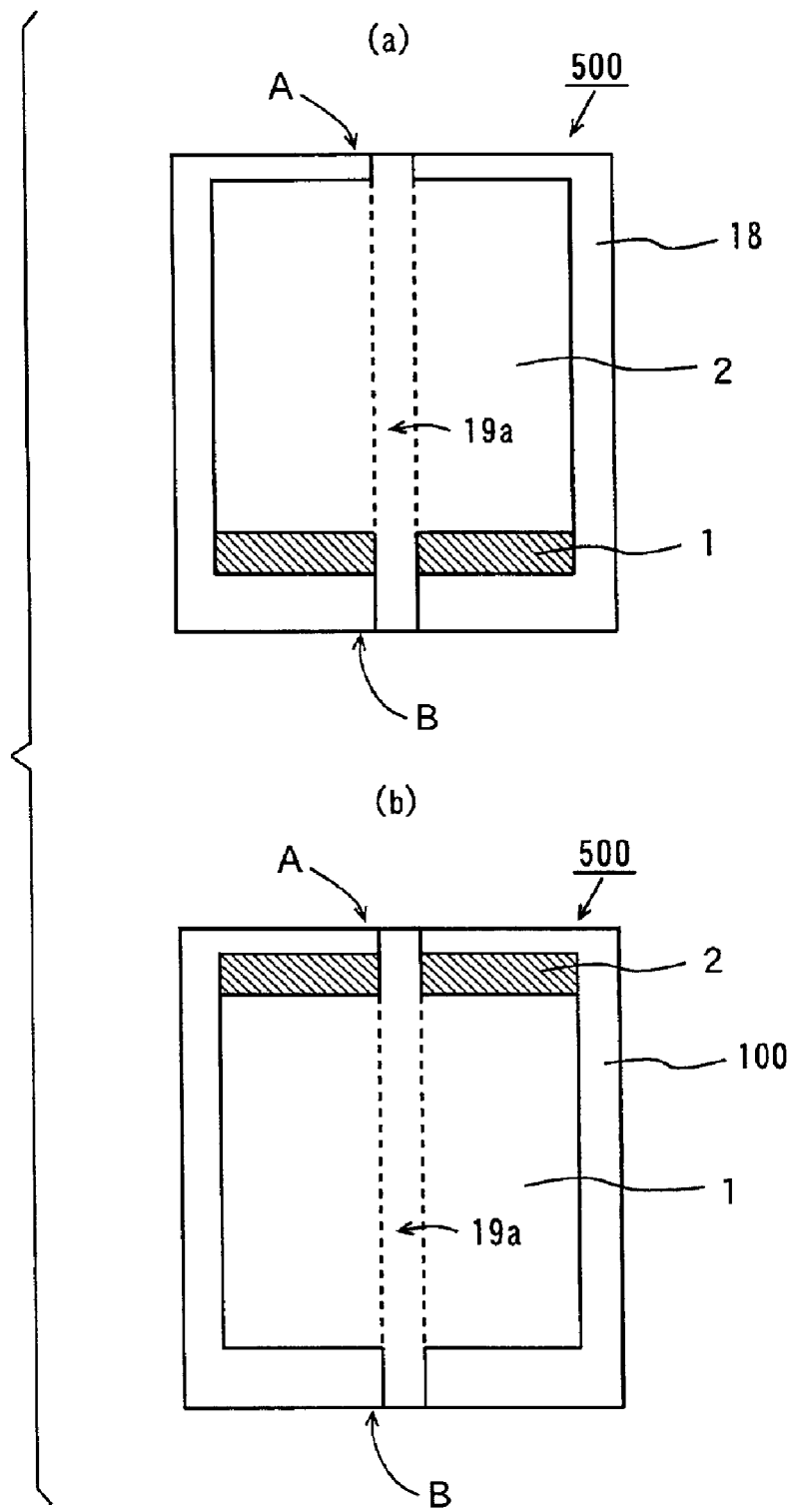
FIG. 2 is a schematic plan view in a case where the semiconductor laser device shown in FIG. 1 is observed from a p-GaN contact layer and a case where it is observed from a transparent substrate.

FIG. 1 is a schematic perspective view showing a first example of a nitride based semiconductor laser device according to the present invention.

As shown in FIG. 1, a semiconductor laser device 500 is constructed by stacking an n-AlGaN cladding layer 11, an n-GaN optical guide layer 12, an MQW active layer 13 having a multi-quantum well (MQW) structure, a p-GaN cap layer 14, a p-GaN optical guide layer 15, and a p-AlGaN cladding layer 16 in this order on a transparent substrate 100 having conductive properties composed of GaN, SiC, etc. A striped ridge portion 19 is formed in the p-AlGaN cladding layer 16. On the other hand, an n-AlGaN current blocking layer 17 is formed on a flat portion of the p-AlGaN cladding layer 16. A p-GaN contact layer 18 is formed on the n-AlGaN current blocking layer 17 and on the p-AlGaN cladding layer 16 including the ridge portion 19.

As described in the foregoing, the semiconductor laser device 500 has a striped structure.

An n electrode 1 is formed so as to cover the whole of a striped region 19a below the ridge portion 19 as well as to cover a square region including a part of the striped region 19a on a face on the opposite side of a crystal growth plane of the transparent substrate 100 (hereinafter referred to as a reverse surface).

In this case, a square region of the n electrode 1 is arranged near the center along the cavity length of the transparent substrate 100. Consequently, the area of the striped region 19a on the side of a facet A and the area of the striped region on the side of a facet B are approximately equal to each other.

On the other hand, on the p-GaN contact layer 18, a p electrode 2 is formed so as to cover the whole of the striped region 19a above the ridge portion 19 and so as to cover the square region including a part of the striped region 19a.

In this case, a square region of the p electrode 2 is formed at a position nearer the facet A. Consequently, the area of the striped region 19a on the side of the facet A is smaller than the area of the striped region 19a on the side of the facet B.

Thus in the semiconductor laser device 500, the n electrode 1 and the p electrode 2 have different shapes, and the p electrode 2 has an asymmetric shape in the cavity length direction.

Generally in the semiconductor laser device having a striped structure, the n electrode 1 and the p electrode 2 are formed so as to cover the whole of the striped region 19a, as in the example, in order to uniformly inject a current into the whole of the striped region 19a. The n electrode may not, in some cases, be formed in the vicinity of an end of the striped region 19a from any reason, as in an example, described later.

In the semiconductor laser device 500, the facet A in the cavity length direction is an emission surface of laser light, and a dielectric film (not shown) having a low reflectance is formed at the facet A. In this case, the facet A is taken as a front facet in the cavity length direction (hereinafter referred to as a front facet), and a portion, on the side of the facet A, of the semiconductor laser device 500 is taken as the front thereof.

On the other hand, a dielectric film (not shown) having a high reflectance is formed at the other facet B in the cavity length direction. In this case, the facet B is taken as a rear facet in the cavity length direction (hereinafter referred to as a rear facet), and a portion, on the side of the facet B, of the semiconductor laser device 500 is taken as the rear thereof.

In the semiconductor laser device 500, therefore, a portion, where the square region of the p electrode 2 is arranged, of the device, that is, a portion, where the area of the striped region 19a in the p electrode 2 is small, of the device corresponds to the front thereof, and a portion, where the area of the striped region 19a in the p electrode 2 is large, of the device corresponds to the rear thereof.

In the semiconductor laser device 500, the dielectric film having a low reflectance is formed at the front facet, and the dielectric film having a high reflectance is formed at the rear facet. In the semiconductor laser device 500, therefore, the amount of light emitted from the front facet is increased, thereby making it possible to achieve high output power.

FIG. 2 is a schematic plan view for explaining the positional relationship between the n electrode 1 and the p electrode 2. FIG. 2(a) is a diagram in a case where the semiconductor laser device 500 is observed from the p-GaN contact layer 18, and FIG. 2(b) is a diagram in a case where the semiconductor laser device 500 is observed from the reverse surface of the transparent substrate 100.

In FIGS. 2(a) and 2(b), a region enclosed by two broken lines indicates a striped region 19a above and below the ridge portion 19. A hatched portion indicates an electrode portion, on the opposite side of the transparent substrate 100, which can be seen upon penetrating through the transparent substrate 100 and each of the layers 11 to 18.

In the semiconductor laser device 500, each of the layers 11 to 18 and the transparent substrate 100 are transparent, and the n electrode 1 and the p electrode 2 are formed at different positions. When the semiconductor laser device 500 is observed from the p-GaN contact layer 18, as shown in FIG. 2(a), therefore, the p electrode 2 can be directly observed, and a predetermined portion of the n electrode 1 formed on the opposite side, that is, on the side of the reverse surface of the transparent substrate 100 can be observed upon penetrating through each of the layers 11 to 18 and the transparent substrate 100.

The predetermined portion of the n electrode 1 observed in this case is a portion, of the n electrode 1, whose shape does not coincide with the shape of the p electrode 2, that is, a portion, of the n electrode 1, extending out of a p electrode forming region. Here, a part of the n electrode 1 is observed on the side of the facet B.

On the other hand, when the semiconductor laser device 500 is observed from the reverse surface of the transparent substrate 100, as shown in FIG. 2(b), the n electrode 1 can be directly observed, and a predetermined portion of the p electrode 2 formed on the opposite side, that is, on the side of the p-GaN contact layer 18 can be observed upon penetrating through the transparent substrate 100 and each of the layers 11 to 18.

The predetermined portion of the p electrode 2 observed in this case is a portion, of the p electrode 2, whose shape does not coincide with the shape of the n electrode 1, that is, a portion, of the p electrode 2, extending out of an n electrode forming region. A part of the p electrode 2 is observed on the side of the facet A.

As described in the foregoing, in the semiconductor laser device 500, the portion, where the square region of the p electrode 2 is arranged offset (on the side of the facet A), of the device corresponds to the front thereof, and the portion, on the opposite side (on the side of the facet B), of the device corresponds to the rear thereof.

When the semiconductor laser device 500 is observed from the p-GaN contact layer 18, the portion, where the square region of the p electrode 2 is arranged offset, of the device can be directly confirmed, as shown in FIG. 2(a). In this case, the n electrode 1 formed on the opposite side in a region where the p electrode 2 is not arranged can be seen upon penetrating through the transparent substrate 100 and each of the layers 11 to 18. Accordingly, the portion, where the p electrode 2 is arranged offset, of the device can be confirmed.

As described in the foregoing, when the semiconductor laser device 500 is observed from the p-GaN contact layer 18, the portion, where the square region of the p electrode 2 is arranged offset, of the device, that is, the front of the device can be easily identified. Consequently, it is possible to easily and accurately distinguish the forward and backward directions of the device.

When the semiconductor laser device 500 is observed from the reverse surface of the transparent substrate 100, the p electrode 2 formed on the opposite side can be seen upon penetrating through the transparent substrate 100 and each of the layers 11 to 18, as shown in FIG. 2(b). Accordingly, the portion, where the p electrode 2 is arranged offset, of the device can be confirmed. Even in this case, therefore, the portion, where the square region of the p electrode 2 is arranged offset, of the device, that is, the front of the device can be easily identified. Consequently, it is possible to easily and accurately distinguish the forward and backward directions of the device.

Thus in the semiconductor laser device 500, even when the device is observed from either the p-GaN contact layer 18 or the reverse surface of the transparent substrate 100, it is possible to easily and accurately distinguish the forward and backward directions of the device on the basis of the shapes and the forming positions of the n electrode 1 and the p electrode 2.

Furthermore, in the semiconductor laser device 500, the n electrode 1 and the p electrode 2 differ in the shape. Accordingly, it is possible to easily distinguish the main surface and the reverse surface of the device on the basis of the shapes of the electrodes 1 and 2.

At the time of fabricating the semiconductor laser device 500, the layers 11 to 18 are first grown on the transparent substrate 100. Thereafter, the n electrode 1 and the p electrode 2 are formed at the above-mentioned positions in the above-mentioned shape by an etching method or a lift-off method. The order in which the n electrode 1 and the p electrode 2 are formed is arbitrary.

The n electrode 1 in this case is constructed by stacking a Ti film, an Al film and a Ti film in this order, is constructed by stacking a Ti film and an Al film in this order, is constructed by stacking an Ni film, a Ti film and an Au film in this order, or is constructed by stacking a Ti film, a Pt film and an Au film in this order.

On the other hand, the p electrode 2 in this case is composed of an Ni film, is constructed by stacking a Ti film, a Pt film and an Au film in this order, is constructed by stacking a Pd film, a Pt film and an Au film in this order, is constructed by stacking an Ni film, an Au film, a Ti film and an Au film in this order, is constructed by stacking an Ni film and an Au film in this order, or is constructed by stacking an Ni film, a Pt film and an Au film in this order.

A combination of a material for forming the n electrode 1 and a material for forming the p electrode 2 is arbitrary.

As described in the foregoing, the n electrode 1 and the p electrode 2 which differ in the shape are formed at positions which are shifted from each other, and the layers 11 to 18, together with the transparent substrate 100, are divided by cleavage. Consequently, the facet A and the facet B are exposed, to produce a cavity. Further, dielectric films having suitable reflectances are respectively formed at the facets A and B.

The dielectric film is formed by stacking a plurality of films such as an $SiO_2$ film and a $TiO_2$ film, for example. In such a dielectric film, the type of layers composing the dielectric film, the number of layers composing the dielectric film, and the thickness of the dielectric film are adjusted, thereby adjusting the reflectance. In this case, a dielectric film having a low reflectance is formed at the facet A to be a front facet, and a dielectric film having a high reflectance is formed at the facet B to be a rear facet, as described above.

In this case, the n electrode 1 and the p electrode 2 which differ in the shape are formed at positions which are shifted from each other are formed, as described above, in the electrode forming step. Accordingly, it is possible to easily distinguish the forward and backward directions of the device on the basis of the shapes and the forming positions of the n electrode 1 and the p electrode 2. Consequently, in the dielectric film forming step, it is possible to form a dielectric film having a reflectance suitable for each of the facets A and B at high efficiency and with a high yield.

After the dielectric film is thus formed, the layers 11 to 18, together with the transparent substrate 100, are divided by cleavage into semiconductor laser devices 500.

Finally, the semiconductor laser device 500 fabricated in the above-mentioned manner is arranged on a sub-mount or the like, thereby assembling a semiconductor laser apparatus.

As described above, in the semiconductor laser device 500, even when the device is observed from either the reverse surface of the transparent substrate 100 or the p-GaN contact layer 18, it is possible to easily and accurately distinguish the forward and backward directions of the device on the basis of the forming positions of the n electrode 1 and the p electrode 2.

In the semiconductor laser apparatus using the semiconductor laser device 500, therefore, it is possible to easily and accurately distinguish the forward and backward directions of the semiconductor laser device 500 as well as to arrange the semiconductor laser device 500 on a sub-mount or the like in a correct direction to assemble the apparatus. Therefore, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 500, the fabrication efficiency thereof is improved, and the fabrication cost thereof is reduced.

Figure 3:
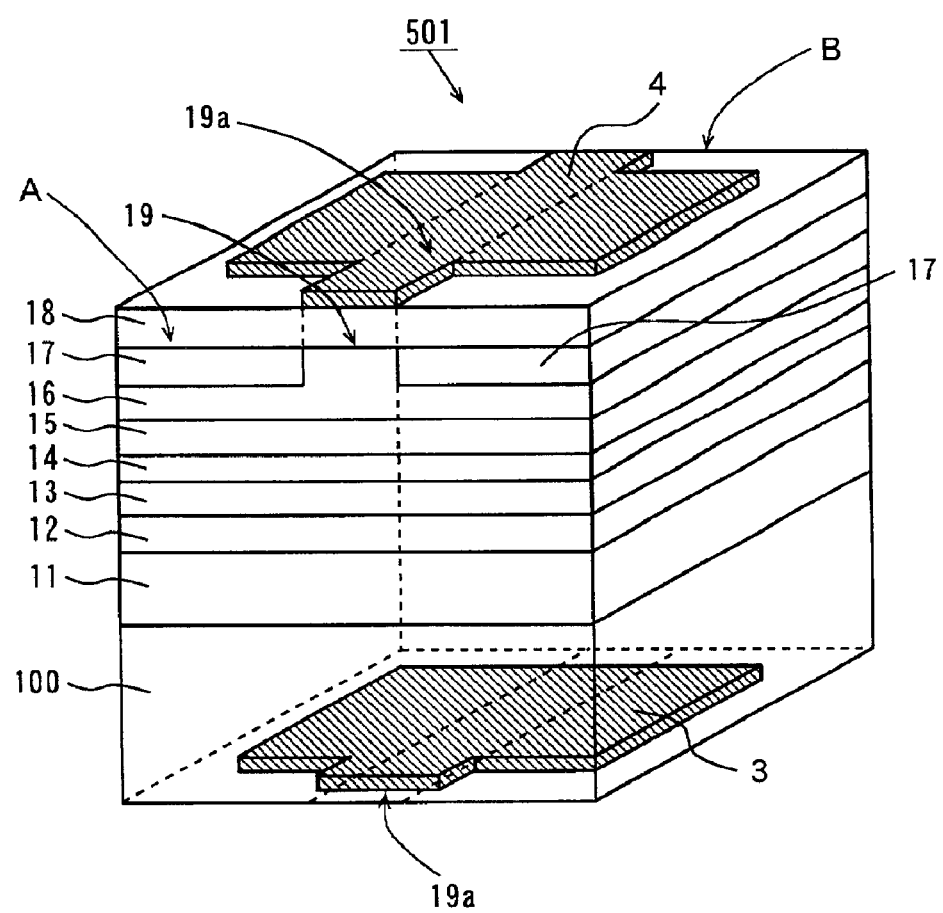
FIG. 3 is a schematic perspective view showing a second example of the semiconductor laser device according to the present invention.

FIG. 3 is a schematic perspective view showing a second example of the semiconductor laser device according to the present invention. A semiconductor laser device 501 shown in FIG. 3 has the same structure as the semiconductor laser device 500 shown in FIG. 1 except for the following.

As shown in FIG. 3, in the semiconductor laser device 501, an n electrode 3 having a projected shape is formed on the reverse surface of a transparent substrate 100. In this case, the n electrode 3 is not formed in the vicinity of an end of a striped region 19a.

In the semiconductor laser device 501 in this example, a portion, on the side of a facet A at which a projection of the n electrode 3 is formed, of the device corresponds to the front (an emission surface of laser light) thereof, and a portion, on the side of a facet B at which a wide portion of the n electrode 3 is formed, of the device corresponds to the rear (a surface opposite to the emission surface) thereof.

On the other hand, a p electrode 4 is formed so as to cover the whole of the striped region 19a as well as to cover a square region including a part of the striped region 19a. In the p electrode 4, the forward and backward directions of the device are not distinguished.

Thus in the semiconductor laser device 501 in this example, the n electrode 3 and the p electrode 4 differ in the shape, and the n electrode 3 has an asymmetric shape in its cavity length direction.

A material for the n electrode 3 and a material for the p electrode 4 are the same as those for the n electrode 1 and the p electrode 2.

Figure 4:
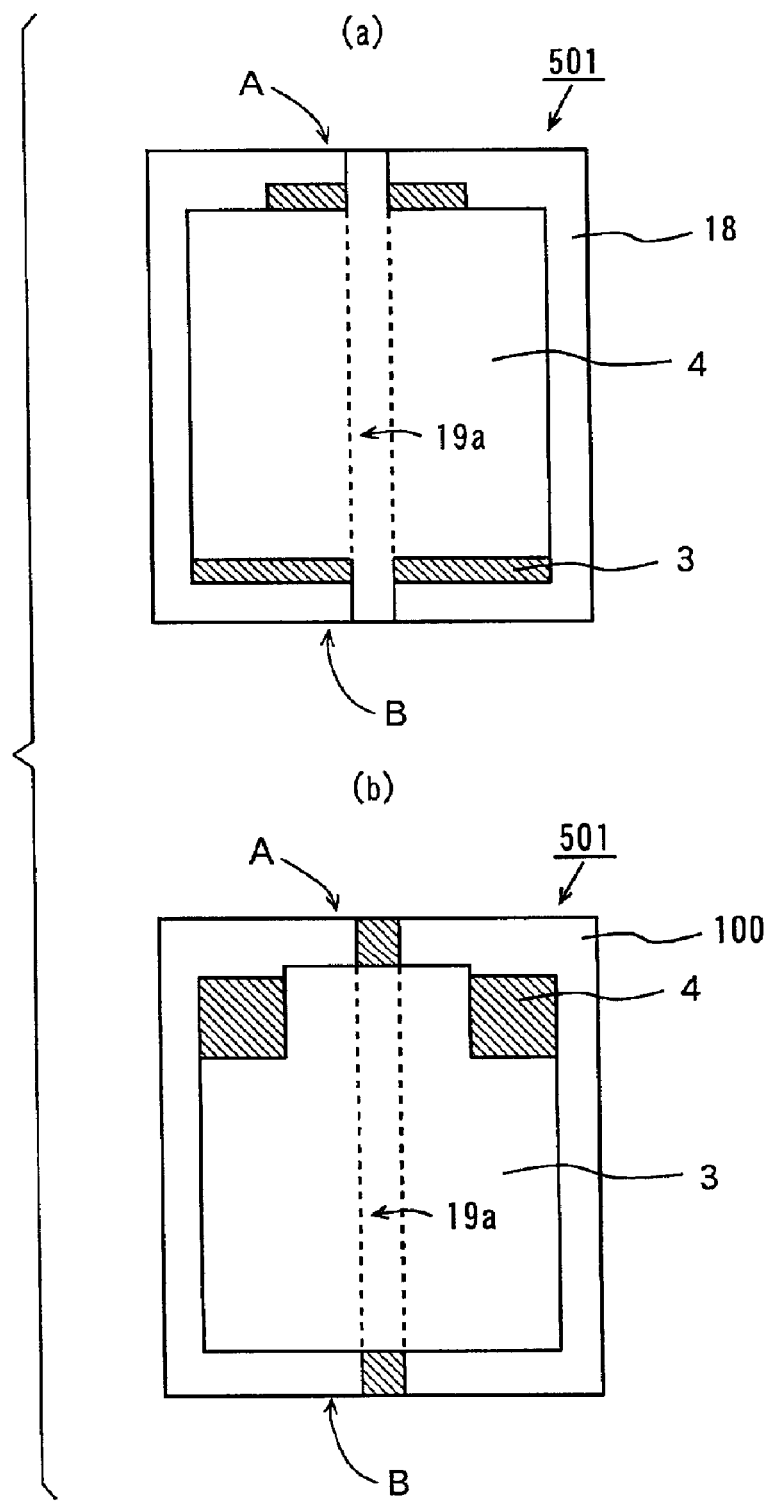
FIG. 4 is a schematic plan view in a case where the semiconductor laser device shown in FIG. 2 is observed from a p-GaN contact layer and a case where it is observed from a transparent substrate.

FIG. 4 is a schematic plan view for explaining the positional relationship between the n electrode 3 and the p electrode 4 in the semiconductor laser device 501. FIG. 4(a) is a diagram in a case where the semiconductor laser device 501 is observed from a p-GaN contact layer 18, as in FIG. 2(a). FIG. 4(b) is a diagram in a case where the semiconductor laser device 501 is observed from the reverse surface of the transparent substrate 100, as in FIG. 2(b).

In the semiconductor laser device 501, each of the layers 11 to 18 and the transparent substrate 100 are transparent, and the n electrode 3 and the p electrode differ in the shape. When the semiconductor laser device 501 is observed from the p-GaN contact layer 18, as shown in FIG. 4(a), therefore, the p electrode 4 can be directly observed, and a predetermined portion (a hatched portion) of the n electrode 3 formed on the opposite side, that is, on the side of the reverse surface of the transparent substrate 100 can be observed upon penetrating through each of the layers 11 to 18 and the transparent substrate 100.

The predetermined portion of the n electrode 3 observed in this case is a portion, of the n electrode 3, whose shape does not coincide with the shape of the p electrode 4, that is, a portion, of the n electrode 3, extending out of a p electrode forming region. A part of the projection of the n electrode 3 is observed on the side of the facet A, and a part of the wide portion of the n electrode 3 is observed on the side of the facet B.

On the other hand, when the semiconductor laser device 501 is observed from the reverse surface of the transparent substrate 100, as shown in FIG. 4(b), the n electrode 3 can be directly observed, and a predetermined portion (a hatched portion) of the p electrode 4 formed on the opposite side, that is, on the side of the p-GaN contact layer 18 can be observed upon penetrating through the transparent substrate 100 and each of the layers 11 to 18.

The predetermined portion of the p electrode 4 observed in this case is a portion, of the p electrode 4, whose shape does not coincide with the shape of the n electrode 3, that is, a portion, of the p electrode, extending out of an n electrode forming region. Here, the p electrode 4 can be observed in the vicinity of an end of the striped region 19a, and a part of the p electrode 4 can be observed on the side of the facet A.

As described in the foregoing, in the semiconductor laser device 501, the portion, where the projection of the n electrode 3 having a projected shape is formed (on the side of the facet A), of the device corresponds to the front thereof, and the portion, where the wide portion of the n electrode 3 is formed (on the side of the facet B), of the device corresponds to the rear thereof.

In the semiconductor laser device 501, when the device is observed from the reverse surface of the transparent substrate 100, a portion, on the side of the projection of the n electrode 3, of the device, that is, the front of the device can be directly confirmed, as shown in FIG. 4(b). Consequently, it is possible to easily and accurately distinguish the forward and backward directions of the device on the basis of the shape of the n electrode 3.

Furthermore, in the semiconductor laser device 501, even when the device is observed from the p-GaN contact layer 18, as shown in FIG. 4(a), a part of the projection and a part of the wide portion of the n electrode 3 formed on the reverse surface of the transparent substrate 100 can be seen upon penetrating through each of the layers 11 to 18 and the transparent substrate 100. Even when the device is observed from the p-GaN contact layer 18, therefore, the portion, on the side of the projection of the n electrode 3, of the device, that is, the front of the device can be easily confirmed. When the device is observed from the p-GaN contact layer 18, therefore, it is possible to easily and accurately distinguish the forward and backward directions of the device on the basis of the shape of the n electrode 3 which can be seen upon penetrating through each of the layers 11 to 18 and the transparent substrate 100.

As described in the foregoing, in the semiconductor laser device 501 in this example, even when the device is observed from either the p-GaN contact layer 18 or the reverse surface of the transparent substrate 100, it is possible to easily and accurately distinguish the forward and backward directions of the device on the basis of the shape of the n electrode 3.

Furthermore, in the semiconductor laser device 501, the n electrode 3 and the p electrode 4 differ in the shape, thereby making it possible to distinguish the main surface and the reverse surface of the device on the basis of the shapes of the electrodes 3 and 4.

In a semiconductor laser apparatus using the semiconductor laser device 501, it is possible to easily and accurately distinguish the forward and backward directions of the semiconductor laser device 501 as well as to arrange the semiconductor laser device 501 on a sub-mount or the like in a correct direction to assemble the apparatus. Consequently, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 500, the fabrication efficiency thereof is improved, and the fabrication cost thereof is reduced.

FIG. 5 is a schematic perspective view showing a third example of the semiconductor laser device according to the present invention. A semiconductor laser device 502 shown in FIG. 5 has the same structure as the semiconductor laser device 500 shown in FIG. 1 except for the following.

As shown in FIG. 5, in the semiconductor laser device 502, an n electrode 5 having a square shape is formed on a predetermined region of the reverse surface of a transparent substrate 100. In this case, the n electrode 5 is not formed in the vicinity of an end of a striped region 19a. In the n electrode 5, the forward and backward directions of the device are not distinguished.

On the other hand, on a p-GaN contact layer 18, a p electrode 6 is formed so as to cover the whole of the striped region 19a as well as to cover a projected region including a part of the striped region 19a.

In the semiconductor laser device 502 in this example, a portion, on the side of a facet A at which a projection of the p electrode 6 is formed, of the device corresponds to the front (an emission surface of laser light) thereof, and a portion, on the side of a facet B at which a wide portion of the p electrode 6 is formed, of the device corresponds to the rear (a surface opposite to the emission surface) thereof.

As described in the foregoing, in the semiconductor laser device 502 in this example, the n electrode 5 and the p electrode 6 differ in the shape, and the p electrode 6 has an asymmetric shape in its cavity length direction.

A material for the n electrode 5 and a material for the p electrode 6 are the same as those for the n electrode 1 and the p electrode 2.

Figure 6:
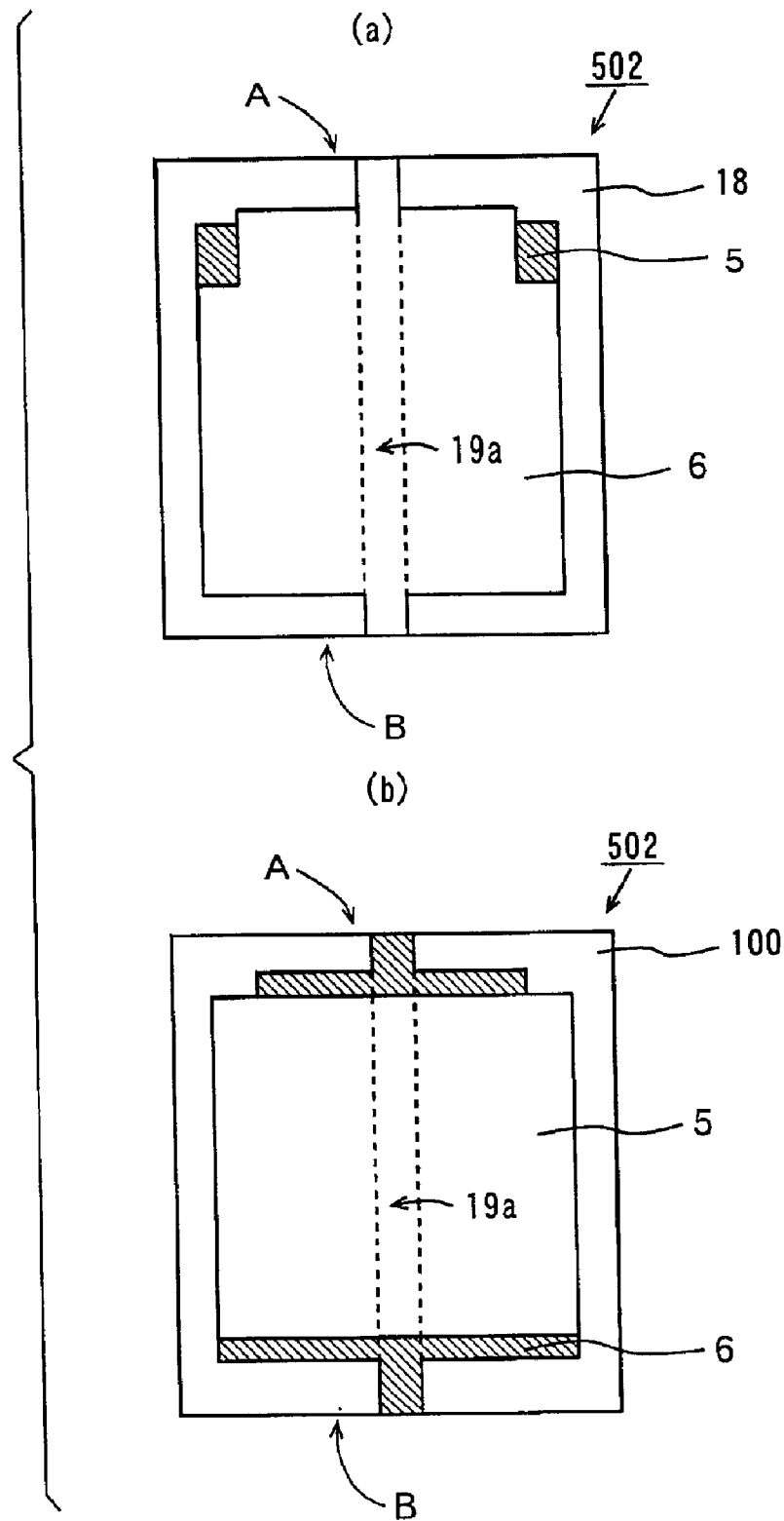
FIG. 6 is a schematic plan view in a case where the semiconductor laser device shown in FIG. 5 is observed from a p-GaN contact layer and a case where it is observed from a transparent substrate.

FIG. 6 is a schematic plan view for explaining the positional relationship between the n electrode 5 and the p electrode 6 in the semiconductor laser device 502. FIG. 6(a) is a diagram in a case where the semiconductor laser device 502 is observed from the p-GaN contact layer 18, as in FIG. 2(a). FIG. 6(b) is a diagram in a case where the semiconductor laser device 502 is observed from the reverse surface of the transparent substrate 100, as in FIG. 2(b).

In the semiconductor laser device 502, each of the layers 11 to 18 and the transparent substrate 100 are transparent, and the n electrode 5 and the p electrode 6 differ in the shape. When the semiconductor laser device 502 is observed from the p-GaN contact layer 18, as shown in FIG. 6(a), therefore, the p electrode 6 can be directly observed, and a predetermined portion (a hatched portion) of the n electrode 5 formed on the opposite side, that is, on the side of the reverse surface of the transparent substrate 100 can be observed upon penetrating through each of the layers 11 to 18 and the transparent substrate 100.

The predetermined portion of the n electrode 5 observed in this case is a portion, of the n electrode 5, whose shape does not coincide with the shape of the p electrode 6, that is, a portion, of the n electrode 5, extending out of a p electrode forming region. Here, a part of the n electrode 5 can be observed on the side of the facet A.

On the other hand, when the semiconductor laser device 502 is observed from the reverse surface of the transparent substrate 100, as shown in FIG. 6(b), the n electrode 5 can be directly observed, and a predetermined portion (a hatched portion) of the p electrode 6 formed on the opposite side, that is, on the side of the p-GaN contact layer 18 can be observed upon penetrating through the transparent substrate 100 and each of the layers 11 to 18.

The predetermined portion of the p electrode 6 observed in this case is a portion, of the p electrode 6, whose shape does not coincide with the shape of the n electrode 5, that is, a portion, of the p electrode 6, extending out of an n electrode forming region. Here, the p electrode 6 can be observed in the vicinity of an end of the striped region 19a, and a part of the projection of the p electrode 6 can be observed on the side of the facet A. Further, a part of the wide portion of the p electrode 6 can be observed on the side of the facet B.

As described in the foregoing, in the semiconductor laser device 502, the portion, where the projection of the p electrode 6 having a projected shape is formed (on the side of the facet A), of the device corresponds to the front thereof, and the portion, where the wide portion of the p electrode 6 is formed (on the side of the facet B), of the device corresponds to the rear thereof.

In the semiconductor laser device 502, when the device is observed from the p-GaN contact layer 18, as shown in FIG. 6(a), the portion, on the side of the projection of the p electrode 6, of the device, that is, the front of the device can be directly confirmed. When the device is observed from the p-GaN contact layer 18, therefore, it is possible to easily and accurately distinguish the forward and backward directions of the device on the basis of the shape of the p electrode 6.

Furthermore, in the semiconductor laser device 502, even when the device is observed from the reverse surface of the transparent substrate 100, as shown in FIG. 6(b), a part of the projection of the p electrode 6 formed on the side of the p-GaN contact layer 18 and a part of the wide portion thereof can be seen upon penetrating through the transparent substrate 100 and each of the layers 11 to 18. Even when the device is observed from the transparent substrate 100, therefore, the portion, on the side of the projection of the p electrode 6, of the device, that is, the front of the device can be easily confirmed. When the device is observed from the reverse surface of the transparent substrate 100, therefore, it is possible to easily and accurately distinguish the forward and backward directions of the device on the basis of the shape of the p electrode 6 which can be seen upon penetrating through each of the layers 11 to 18 and the transparent substrate 100.

As described in the foregoing, in the semiconductor laser device 502 in this example, even when the device is observed from either the p-GaN contact layer 18 or the reverse surface of the transparent substrate 100, it is possible to easily and accurately distinguish the forward and backward directions of the device on the basis of the shape of the p electrode 6.

Furthermore, in the semiconductor laser device 502, the n electrode 5 and the p electrode 6 differ in the shape. Accordingly, it is possible to distinguish the main surface and the reverse surface of the device on the basis of the shapes of the electrodes 5 and 6.

In a semiconductor laser apparatus using the semiconductor laser device 502, it is possible to easily and accurately distinguish the forward and backward directions of the semiconductor laser device 502 as well as to arrange the semiconductor laser device 502 on a sub-mount or the like in a correct direction to assemble the apparatus. Therefore, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 502, the fabrication efficiency thereof is improved, and the fabrication cost thereof is reduced.

Figure 7:
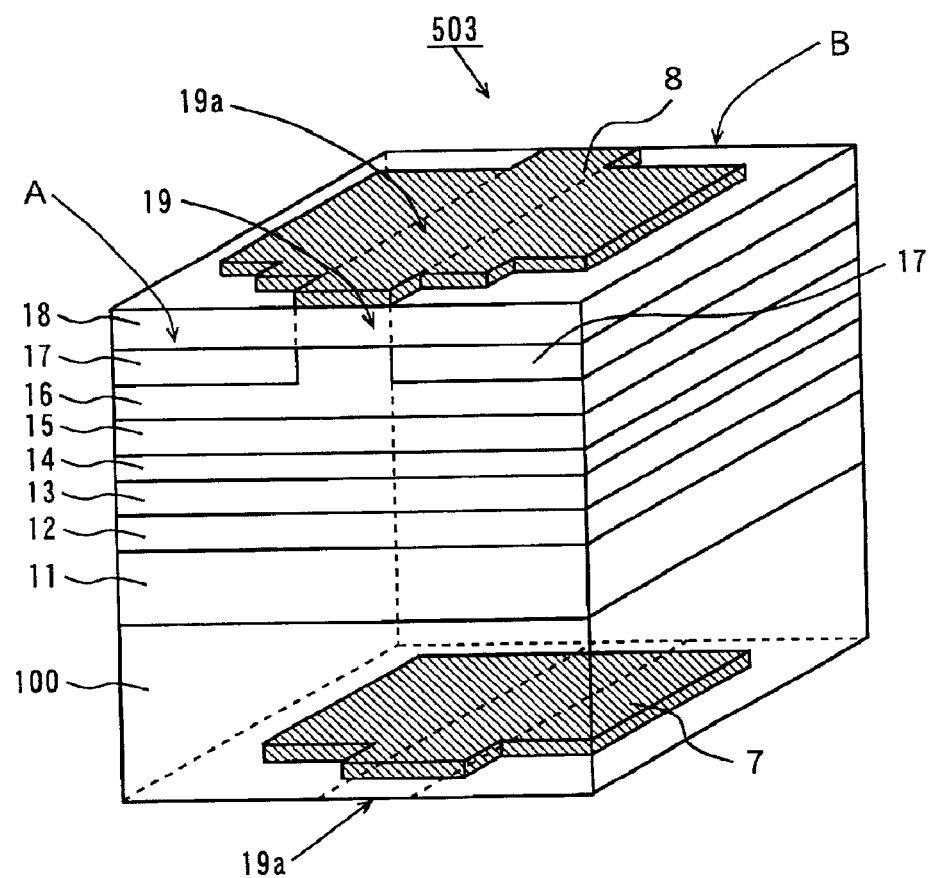
FIG. 7 is a schematic perspective view showing a fourth example of the semiconductor laser device according to the present invention.

FIG. 7 is a schematic perspective view showing a fourth example of the semiconductor laser device according to the present invention. A semiconductor laser device 503 shown in FIG. 7 has the same structure as the semiconductor laser device 500 shown in FIG. 1 except for the following.

As shown in FIG. 7, in the semiconductor laser device 503, an n electrode 7 having a projected shape is formed on a predetermined region of the reverse surface of a transparent substrate 100. In this case, the n electrode 7 is not formed in the vicinity of an end of the striped region 19a.

On the other hand, on the p-GaN contact layer 18, a p electrode 8 is formed so as to cover the whole of the striped region 19a as well as to cover a projected region including a part of the striped region 19a.

Although both the n electrode 7 and the p electrode 8 respectively have projected shapes in this case, the width of the projection of the n electrode 7 is smaller than the width of the projection of the p electrode 8.

In the semiconductor laser device 503 in this example, a portion, on the side of a facet A at which the projections of the n electrode 7 and the p electrode 8 are formed, of the device corresponds to the front (an emission surface of laser light) thereof, and a portion, on the side of a facet B at which wide portions of the p electrode 7 and the p electrode 8 are formed, of the device corresponds to the rear (a surface opposite to the emission surface) thereof.

As described in the foregoing, in the semiconductor laser device 503 in this example, the n electrode 7 and the p electrode 8 differ in the shape, and each of the p electrode 7 and the p electrode 8 has an asymmetric shape in its cavity length direction.

A material for the n electrode 7 and a material for the p electrode 8 are the same as those for the n electrode 1 and the p electrode 2.

Figure 8:
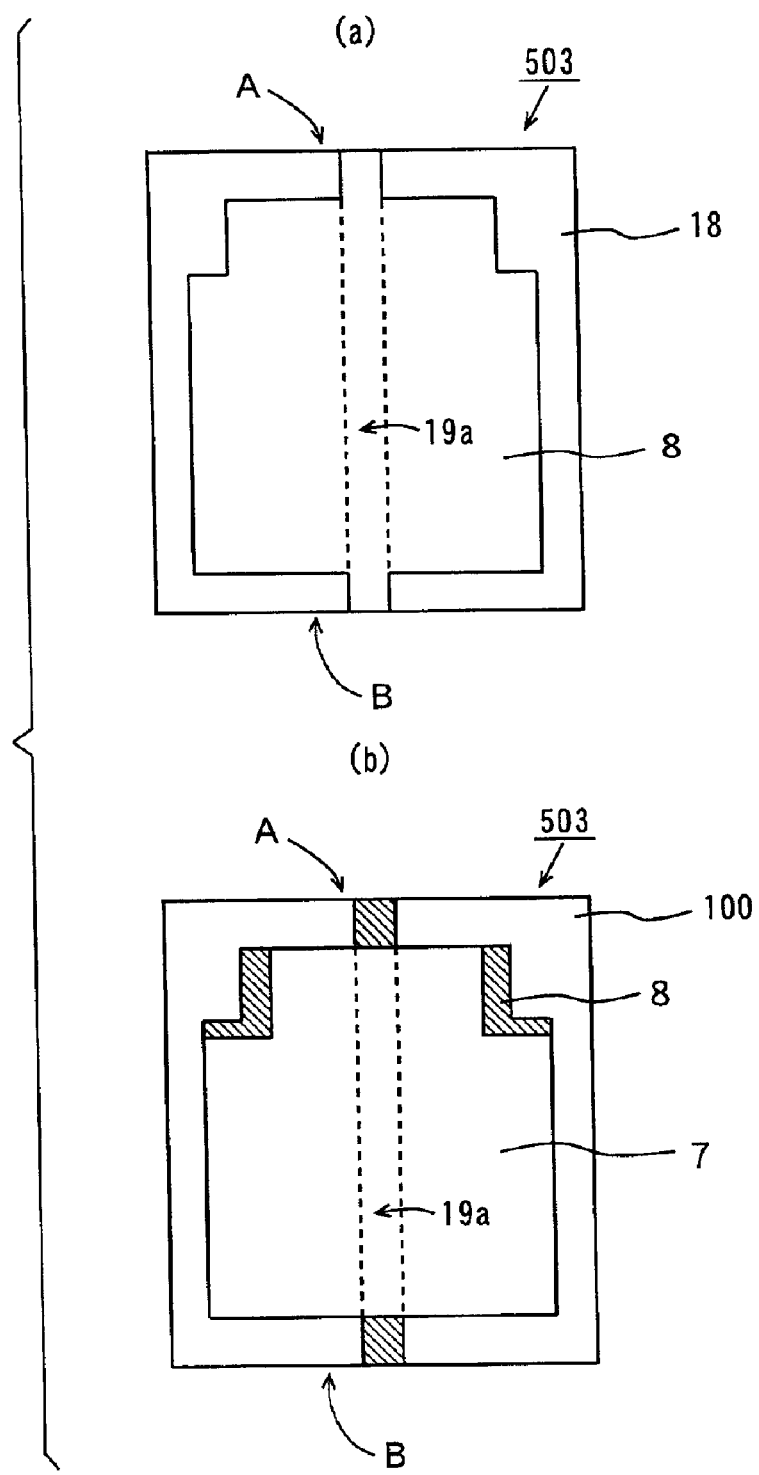
FIG. 8 is a schematic plan view in a case where the semiconductor laser device shown in FIG. 7 is observed from a p-GaN contact layer and a case where it is observed from a transparent substrate.

FIG. 8 is a schematic plan view for explaining the positional relationship between the n electrode 7 and the p electrode 8 in the semiconductor laser device 503. FIG. 8(a) is a diagram in a case where the semiconductor laser device 503 is observed from the p-GaN contact layer 18, as in FIG. 2(a). FIG. 8(b) is a diagram in a case where the semiconductor laser device 503 is observed from the transparent substrate 100, as in FIG. 2(b).

When the semiconductor laser device 503 is observed from the p-GaN contact layer 18, as shown in FIG. 8(a), the p electrode 8 can be directly observed. In this case, the n electrode 7 formed on the opposite side, that is, on the reverse surface of the transparent substrate 100 is contained in a p electrode forming region. When the device is observed from the p-GaN contact layer 18, therefore, the n electrode 7 is not observed.

On the other hand, when the semiconductor laser device 503 is observed from the reverse surface of the transparent substrate 100, as shown in FIG. 8(b), the n electrode 7 can be directly observed, and a predetermined portion (a hatched portion) of the p electrode 8 formed on the opposite side, that is, on the side of the p-GaN contact layer 18 can be observed upon penetrating through the transparent substrate 100 and each of the layers 11 to 18.

The predetermined portion of the p electrode 8 observed in this case is a portion, of the p electrode 8, whose shape does not coincide with the shape of the n electrode 7, that is, a portion, of the p electrode 8, extending out of an n electrode forming region. Here, the p electrode 8 can be observed in the vicinity of an end of the striped region 19a, and a part of the projection of the p electrode 8 can be observed on the side of the facet A.

As described in the foregoing, in the semiconductor laser device 503, the portion, where the projections of the n electrode 7 and the p electrode 8 each having a projected shape are formed, of the device corresponds to the front thereof, and the portion, where the wide portions of the n electrode 7 and the p electrode 8 are formed, of the device corresponds to the rear thereof.

In the semiconductor laser device 503, when the device is observed from the p-GaN contact layer 18, as shown in FIG. 8(a), the portion, on the side of the projection of the p electrode 8, of the device, that is, the front of the device can be directly confirmed. When the device is observed from the p-GaN contact layer 18, therefore, it is possible to easily and accurately distinguish the forward and backward directions of the device on the basis of the shape of the p electrode 8.

Furthermore, in the semiconductor laser device 503, when the device is observed from the reverse surface of the transparent substrate 100, as shown in FIG. 8(*b*), the portion, on the side of the projection of the n electrode 7, of the device, that is, the front of the device can be directly confirmed. When the device is observed from the reverse surface of the transparent substrate 100, therefore, it is possible to easily and accurately distinguish the forward and backward directions of the device on the basis of the shape of the n electrode 7.

As described in the foregoing, in the semiconductor laser device 503, even when the device is observed from either the reverse surface of the transparent substrate 100 or the p-GaN contact layer 18, it is possible to easily and accurately distinguish the forward and backward directions of the device on the basis of the shapes of the n electrode 7 and the p electrode 8.

Furthermore, in the semiconductor laser device 503, the n electrode 7 and the p electrode 8 differ in the shape, thereby making it possible to easily distinguish the main surface and the reverse surface of the device on the basis of the shapes of the electrodes 7 and 8.

In a semiconductor laser apparatus using the semiconductor laser device 503, it is possible to easily and accurately distinguish the forward and backward directions of the semiconductor laser device 503 as well as to arrange the semiconductor laser device 503 on a sub-mount or the like in a correct direction to assemble the apparatus. Consequently, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 503, the fabrication efficiency thereof is improved, and the fabrication cost thereof is reduced.

Figure 9:
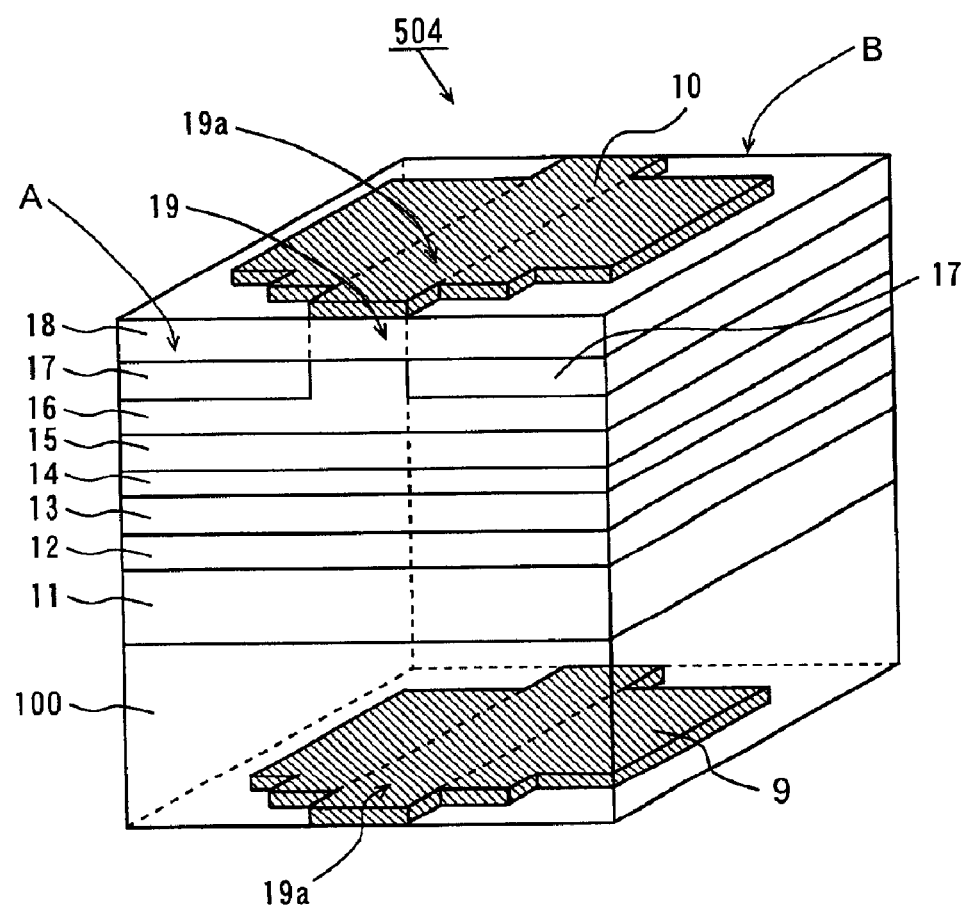
FIG. 9 is a schematic perspective view showing a fifth example of the semiconductor laser device according to the present invention.

FIG. 9 is a schematic perspective view showing a fifth example of the semiconductor laser device according to the present invention. A semiconductor laser device 504 shown in FIG. 9 has the same structure as the semiconductor laser device 503 shown in FIGS. 7 and 8 except that an n electrode 9 and a p electrode 10 have the same shape.

In the semiconductor laser device 504 in this example, a portion, on the side of a facet A at which projections of the n electrode 9 and the p electrode 10 each having a projected shape are formed, of the device corresponds to the front (an emission surface of laser light) thereof, and a portion, on the side of a facet B at which wide portions of the n electrode 9 and the p electrode 10 are formed, of the device corresponds to the rear (a surface opposite to the emission surface) thereof.

Thus in the semiconductor laser device 504 in this example, the n electrode 9 and the p electrode 10 have the same shape, and each of the n electrode 9 and the p electrode 10 has an asymmetric shape in its cavity length direction.

A material for the n electrode 9 and a material for the p electrode 10 are the same as those for the n electrode 1 and the p electrode 2.

Figure 10:
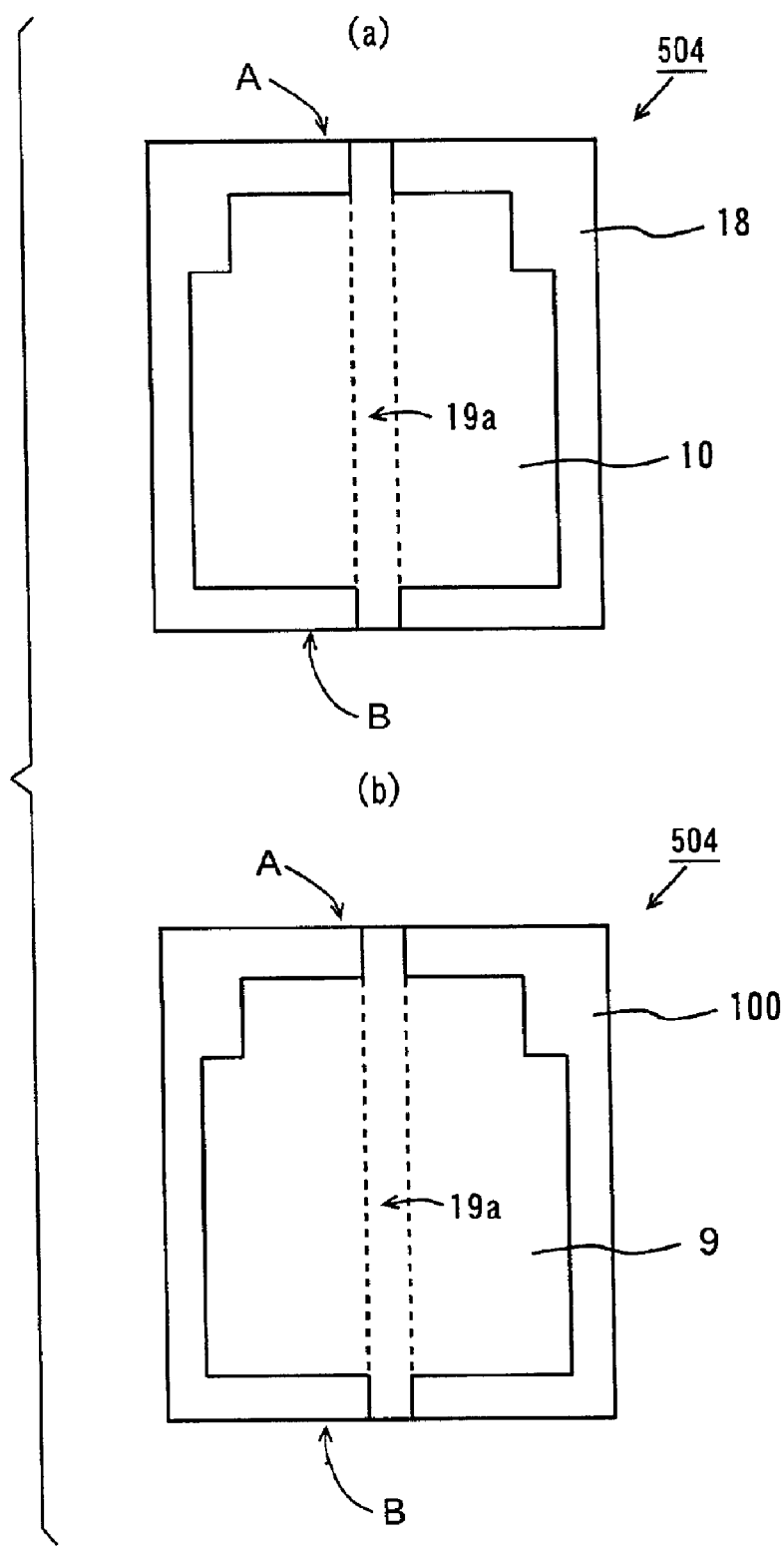
FIG. 10 is a schematic plan view in a case where the semiconductor laser device shown in FIG. 9 is observed from a p-GaN contact layer and a case where it is observed from a transparent substrate.

FIG. 10 is a schematic plan view for explaining the positional relationship between the n electrode 9 and the p electrode 10 in the semiconductor laser device 504. FIG. 10(*a*) is a diagram in a case where the semiconductor laser device 504 is observed from the p-GaN contact layer 18, as in FIG. 2(*a*). FIG. 10(*b*) is a diagram in a case where the semiconductor laser device 504 is observed from the reverse surface of the transparent substrate 100, as in FIG. 2(*b*).

In the semiconductor laser device 504, the n electrode 9 and the p electrode 10 have the same shape, as described above. Even when the semiconductor laser device 504 is observed from either the p-GaN contact layer 18 or the reverse surface of the transparent substrate 100, as shown in FIG. 10(*a*) or 10(*b*), the electrode formed on the opposite side of the transparent substrate 100 is not observed upon penetrating through each of layers 11 to 18 and the transparent substrate 100.

Specifically, when the device is observed from the p-GaN contact layer 18, as shown in FIG. 10(*a*), the p electrode 10 is only directly observed. Further, when the device is observed from the reverse surface of the transparent substrate 100, as shown in FIG. 10(*b*), the n electrode 9 is only directly observed.

As described in the foregoing, in the semiconductor laser device 504, the portion, where the projections of the n electrode 9 and the p electrode 10 each having a projected shape are formed (on the side of the facet A), of the device corresponds to the front thereof, and the portion, where the wide portions of the n electrode 9 and the p electrode 10 are formed, of the device corresponds to the rear thereof.

In the semiconductor laser device 504, when the device is observed from the p-GaN contact layer 18, as shown in FIG. 10(*a*), the portion, on the side of the projection of the p electrode 10, of the device, that is, the front of the device can be directly confirmed. When the device is observed from the p-GaN contact layer 18, therefore, it is possible to easily and accurately distinguish the forward and backward directions of the device on the basis of the shape of the p electrode 10.

Furthermore, in the semiconductor laser device 504, even when the device is observed from the reverse surface of the transparent substrate 100, as shown in FIG. 10(*b*), the portion, on the side of the projection of the n electrode 9, of the device, that is, the front of the device can be directly confirmed. When the device is observed from the reverse surface of the transparent substrate 100, therefore, it is possible to easily and accurately distinguish the forward and backward directions of the device on the basis of the shape of the n electrode 9.

As described in the foregoing, in the semiconductor laser device 504, even when the device is observed from either the reverse surface of the transparent substrate 100 or the p-GaN contact layer 18, it is possible to easily and accurately distinguish the forward and backward directions of the device on the basis of the shapes of the n electrode 9 and the p electrode 10.

In a semiconductor laser apparatus using the semiconductor laser device 504, it is possible to easily and accurately distinguish the forward and backward directions of the semiconductor laser device 504 as well as to arrange the semiconductor laser device 504 on a sub-mount or the like in a correct direction to assemble the apparatus. Therefore, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 504, the fabrication efficiency thereof is improved, and the fabrication cost thereof is reduced.

In the semiconductor laser device 504, the n electrode 9 and the p electrode 10 having the same shape are formed at the same position, thereby making it difficult to distinguish the main surface and the reverse surface of the device on the basis of the n electrode 9 and the p electrode 10. On the other hand, even in the n electrode and the p electrode having the same shape, the forming positions thereof are shifted, thereby making it possible to distinguish the main surface and the reverse surface of the device from the forming positions of the electrodes. This case will be described below.

Figure 11:
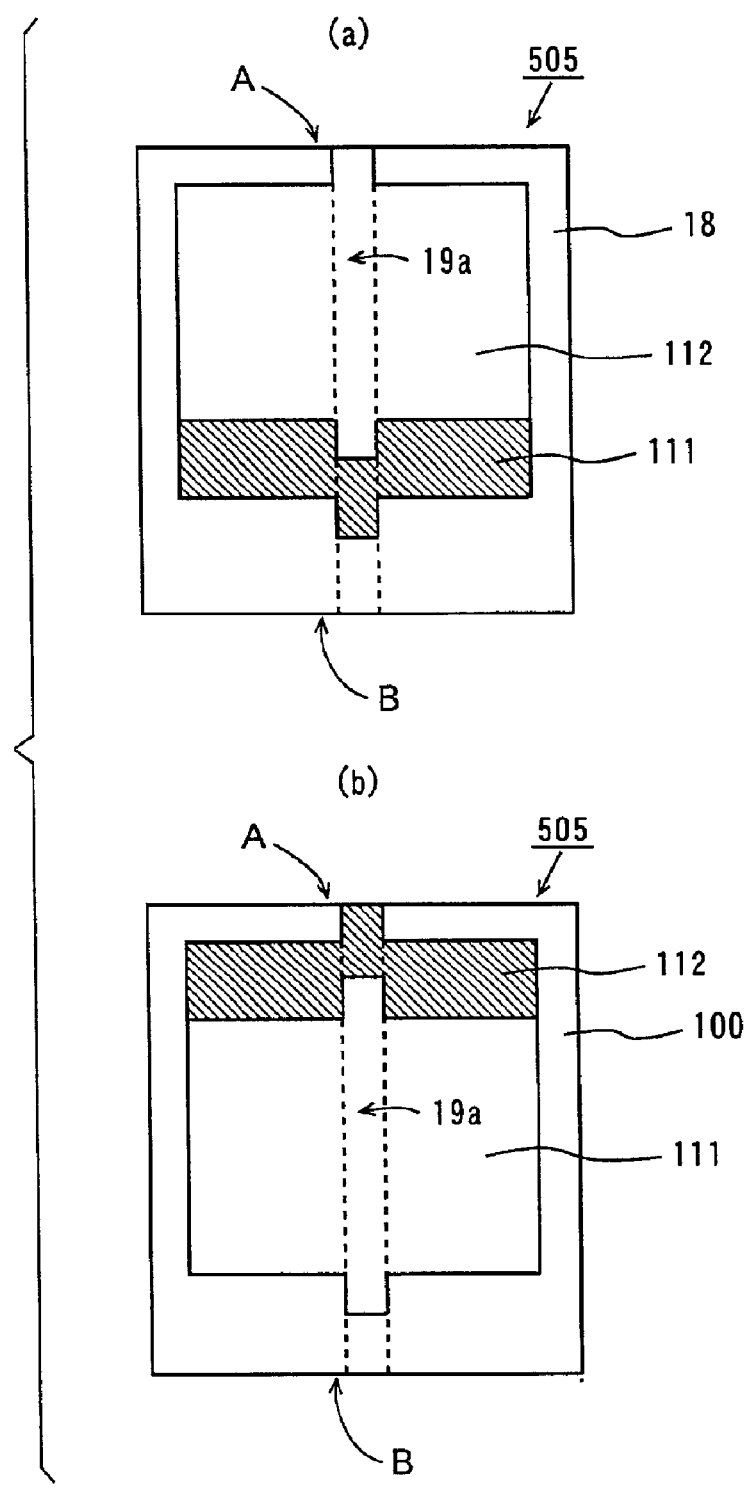
FIG. 11 is a schematic plan view in a case where a sixth example of the semiconductor laser device according to the present invention is observed from a p-GaN contact layer and a case where it is observed from a transparent substrate.
Figure 12:
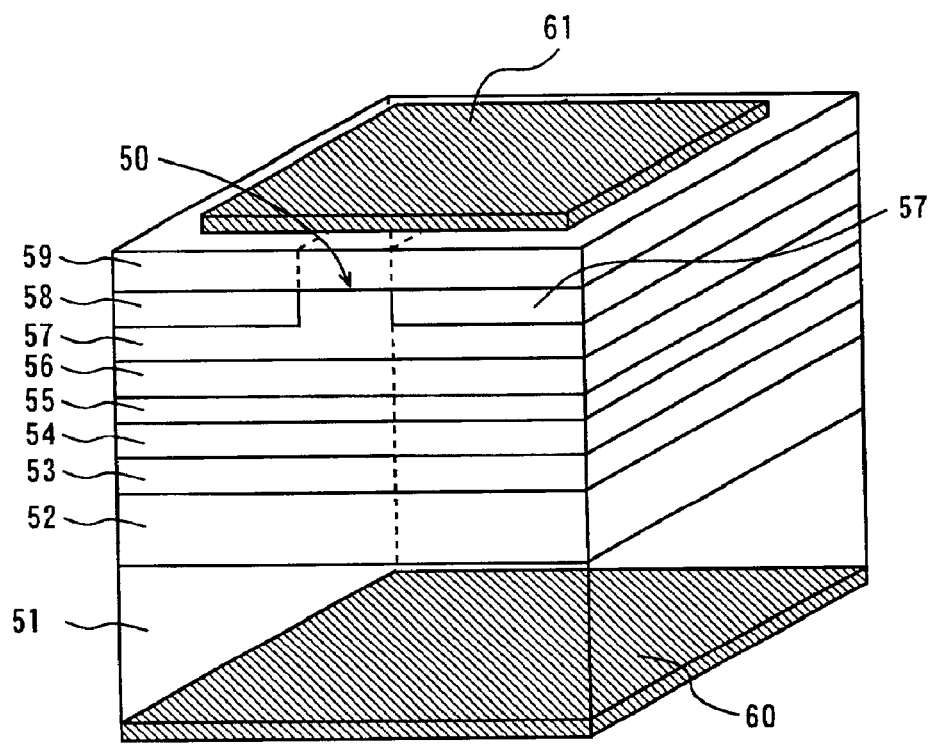
FIG. 12 is a schematic perspective view showing a conventional GaN based semiconductor laser device.

FIG. 11 is a schematic plan view showing a sixth example of the semiconductor laser device according to the present invention. FIG. 11(a) is a diagram in a case where a semiconductor laser device 505 in this example is observed from a p-GaN contact layer, as in FIG. 2(a). FIG. 11(b) is a diagram in a case where the semiconductor laser device 505 in this example is observed from the reverse surface of a transparent substrate 100, as in FIG. 2(b).

The semiconductor laser device 505 shown in FIG. 11 has the same structure as the semiconductor laser device 500 shown in FIG. 1 except for the shapes and the forming positions of an n electrode 111 and a p electrode 112.

As shown in FIGS. 11(a) and 11(b), in the semiconductor laser device 505 in this example, the n electrode 111 and the p electrode 112 having the same shape are formed. In this case, in the shapes of the n electrode 111 and the p electrode 112, the front and the rear of the device in its cavity length direction are not distinguished.

In the semiconductor laser device 505 in this example, the p electrode 112 is formed at a position offset toward a facet A in a p-GaN contact layer 18. In this case, therefore, a portion, on the side of the facet A at which the p electrode 112 is arranged, of the device corresponds emission surface of laser light) thereof, and a portion, on the side of a facet B at which the p electrode 112 is not arranged, of the device corresponds to the rear (a surface opposite to the emission surface) thereof.

In this case, the n electrode 111 is arranged at the center of the transparent substrate 100. Consequently, the forward and backward directions of the device cannot be distinguished by the arrangement of the n electrode 111.

When the semiconductor laser device 505 is observed from the p-GaN contact layer 18, the p electrode 112 can be directly observed, as shown in FIG. 11(a), and a predetermined portion (a hatched portion) of the n electrode 111 formed on the opposite side, that is, on the side of the reverse surface of the transparent substrate 100 can be observed upon penetrating through each of layers 11 to 18 and the transparent substrate 100.

The predetermined portion of the n electrode 111 observed in this case is a portion, of the n electrode 111, whose shape does not coincide with the shape of a p electrode forming region, that is, a portion, of the n electrode 111, formed below a region where the p electrode 112 is not arranged. Here, a part of the n electrode 111 is observed on the side of the facet B.

On the other hand, when the semiconductor laser device 505 is observed from the reverse surface of the transparent substrate 100, as shown in FIG. 11(b), the n electrode 111 can be directly observed, and a predetermined portion (a hatched portion) of the p electrode 112 formed on the opposite side, that is, on the side of the p-GaN contact layer 18 can be observed upon penetrating through the transparent substrate 100 and each of the layers 11 to 18.

The predetermined portion of the p electrode 112 observed in this case is a portion, of the p electrode 112, whose shape does not coincide with the shape of an n electrode forming region, that is, a portion, of the p electrode 112, formed above a region where the n electrode 111 is not arranged. Here, a part of the p electrode 112 is observed on the side of the facet A.

As described in the foregoing, in the semiconductor laser device 505, the portion, where the P electrode 112 is arranged (on the side of the facet A), of the device corresponds to the front thereof, and the portion, where the p electrode 2 is not arranged (on the side of the facet B), of the device corresponds to the rear thereof.

When the semiconductor laser device 505 is observed from the p-GaN contact layer 18, the portion, where the p electrode 112 is arranged, of the device can be directly confirmed, as shown in FIG. 11(a). In this case, the n electrode 111 formed on the opposite side in a region where the p electrode 112 is not arranged can be seen, thereby making it possible to confirm the portion, where the p electrode 112 is arranged, of the device. When the semiconductor laser device 505 is thus observed from the p-GaN contact layer 18, the portion, where the p electrode 112 is arranged, of the device can be directly confirmed. Consequently, it is possible to easily and accurately distinguish the forward and backward directions of the device on the basis of the position where the p electrode 112 is arranged.

When the device is observed from the reverse surface of the transparent substrate 100, the p electrode 112 formed on the opposite side (on the side of the p-GaN contact layer) can be seen upon penetrating through the transparent substrate 100 and each of the layers 11 to 18. Also in this case, therefore, the portion, where the p electrode 112 is arranged, of the device can be easily confirmed. Even when the device is observed from the transparent substrate 100, therefore, it is possible to easily and accurately distinguish the forward and backward directions of the device on the basis of the position where the p electrode 112 is arranged.

Thus in the semiconductor laser device 505, even when the device is observed from either the p-GaN contact layer 18 or the reverse surface of the transparent substrate 100, it is possible to easily and accurately distinguish the forward and backward directions of the device on the basis of the position where the p electrode 112 is arranged.

In a semiconductor laser apparatus using the semiconductor laser device 505, it is possible to easily and accurately distinguish the forward and backward directions of the semiconductor laser device 505 as well as to arrange the semiconductor laser device 505 on a sub-mount or the like in a correct direction to assemble the apparatus. Therefore, the yield in the assembling process of the semiconductor laser apparatus is improved.

In this case, it does not take much time to distinguish the forward and backward directions of the device, thereby making it possible to shorten the tact time in the assembling process. Consequently, the work efficiency in the assembling process of the semiconductor laser apparatus is improved.

As described in the foregoing, in the semiconductor laser apparatus using the semiconductor laser device 505, the fabrication efficiency thereof is improved, and the fabrication cost thereof is reduced.

In the semiconductor laser devices 500 to 505, the structure of each of the layers 11 to 18 is not limited to the above-mentioned structure. Each of the layers 11 to 18 is composed of a nitride based semiconductor containing at least one of Al, Ga, In, B, and Tl.

In the semiconductor laser devices 500 to 505, the shapes of the n electrodes 1, 3, 5, 7, 9, and 111 and the p electrodes 2, 4, 6, 8, 10, and 112 are not limited to the above-mentioned shapes. In obtaining good ohmic contact between the transparent substrate 100 and the n electrode and between the p-GaN contact layer 18 and the p electrode, it is preferable that the areas of the n electrode and the p electrode are large.

Description was made of the case where the n-type layers and the p-type layers are successively formed on the transparent substrate, the p-type layers and the n-type layers may be successively formed on the transparent substrate.

Furthermore, although description was made of the semiconductor laser device having a buried ridge striped structure, the present invention may be applied to semiconductor laser devices having other structures, for example, a ridge striped structure and a self-aligned structure using an insulating film composed of $SiO_2$ or the like as a current blocking layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride based semiconductor laser device comprising:
    a transparent substrate having conductive properties;
    a nitride based semiconductor layer formed on one surface of said transparent substrate and constituting a cavity having a front facet on a side of laser light emission and a rear facet on an opposite side from said front facet, said front facet emitting a larger amount of light than said rear facet;
    a first ohmic electrode of a first conduction type formed on the other surface of said transparent substrate; and
    a second ohmic electrode of a second conduction type formed on said nitride based semiconductor layer,
    wherein at least one of said first and second ohmic electrodes is formed in such an asymmetrical shape or arrangement that the front facet and the rear facet of said cavity of said nitride based semiconductor layer can be distinguished, and
    wherein one of said first and second ohmic electrodes can be observed through said transparent substrate and said nitride based semiconductor layer from the other side of said first and second ohmic electrodes.

2. The nitride based semiconductor laser device according to claim 1, wherein
    said first ohmic electrode and said second ohmic electrode have different shapes.

3. The nitride based semiconductor laser device according to claim 1, wherein
    said first ohmic electrode and said second ohmic electrode have the same shape.

4. The nitride based semiconductor laser device according to claim 1, wherein
    said second ohmic electrode is arranged on a region different from a region above a region where said first ohmic electrode is formed in said nitride based semiconductor layer.

5. The nitride based semiconductor laser device according to claim 1, wherein
    said transparent substrate is composed of gallium nitride or silicon carbide.

6. The nitride based semiconductor laser device according to claim 1, wherein
    said nitride based semiconductor layer contains at least one of gallium, aluminum, indium, boron, and thallium.

7. The nitride based semiconductor laser device according to claim 1, wherein
    at least one of said first and second ohmic electrodes is asymmetric with respect to a line passing through a center point of said cavity length and vertical to the cavity length direction.

8. The nitride based semiconductor laser device according to claim 1, wherein
    said nitride based semiconductor layer has a striped current injection region, and
    said first and second ohmic electrodes respectively have regions opposite to said striped current injection region.

9. The nitride based semiconductor laser device according to claim 1, further comprising
    dielectric films respectively formed at a front facet and a rear facet of said cavity.

10. The nitride based semiconductor laser device according to claim 9, wherein
    said dielectric films respectively formed at the front facet and the rear facet of said cavity have different reflectances.

11. The nitride based semiconductor laser device according to claim 1, wherein
    said nitride based semiconductor layer comprises a cladding layer of a first conduction type, an active layer, and a cladding layer of a second conduction type.

12. A nitride based semiconductor laser device comprising:
    a transparent substrate having conductive properties;
    a nitride based semiconductor layer formed on one surface of said transparent substrate and constituting a cavity having a front facet on a side of laser light emission and a rear facet on an opposite side from said front facet, said front facet emitting a larger amount of light than said rear facet;
    a first ohmic electrode of a first conduction type formed on the other surface of said transparent substrate; and
    a second ohmic electrode of a second conduction type formed on said nitride based semiconductor layer,
    wherein at least one electrode of said first and second ohmic electrodes is formed in such an asymmetrical shape or arrangement that the directions of the front facet and the rear facet of said cavity of said nitride based semiconductor layer can be distinguished, while a shape or arrangement of said one electrode can be distinguished through said transparent substrate and said nitride based semiconductor layer from the side on which the other electrode is formed.

13. The nitride based semiconductor laser device according to claim 12, wherein
    said first ohmic electrode and said second ohmic electrode have different shapes.

14. The nitride based semiconductor laser device according to claim 12, wherein
    said first ohmic electrode and said second ohmic electrode have the same shape.

15. The nitride based semiconductor laser device according to claim 12, wherein
    said transparent substrate is composed of gallium nitride or silicon carbide.

16. The nitride based semiconductor laser device according to claim 12, wherein
    said nitride based semiconductor layer contains at least one of gallium, aluminum, indium, boron, and thallium.

17. The nitride based semiconductor laser device according to claim 12, wherein at least one of said first and second ohmic electrodes is asymmetric with respect to a line passing through a center point of said cavity length and vertical to the cavity length direction.

18. The nitride based semiconductor laser device according to claim 12, wherein said nitride based semiconductor layer has a striped current injection region, and said first and second ohmic electrodes respectively have regions opposite to said striped current injection region.

19. The nitride based semiconductor laser device according to claim 12, further comprising dielectric films respectively formed at a front facet and a rear facet of said cavity.

20. The nitride based semiconductor laser device according to claim 19, wherein said dielectric films respectively formed at the front facet and the rear facet of said cavity have different reflectances.

21. The nitride based semiconductor laser device according to claim 12, wherein said nitride based semiconductor layer comprises a cladding layer of a first conduction type, an active layer, and a cladding layer of a second conduction type.

22. A nitride based semiconductor laser device comprising:

a transparent substrate having conductive properties;

a nitride based semiconductor layer formed on one surface of said transparent substrate and constituting a cavity having a front facet on a side of laser light emission and a rear facet on an opposite side from said front facet, said front facet emitting a larger amount of light than said rear facet;

a first ohmic electrode of a first conduction type formed on the other surface of said transparent substrate; and a second ohmic electrode of a second conduction type formed on said nitride based semiconductor layer, wherein said second ohmic electrode is protruded from a region where said first ohmic electrode is formed when said nitride based semiconductor laser device is observed from the side of said nitride based semiconductor layer, and said first ohmic electrode is protruded from a region where said second ohmic electrode is formed when said nitride based semiconductor laser device is observed from the side of said transparent substrate.

23. The nitride based semiconductor laser device according to claim 22, wherein said first ohmic electrode and said second ohmic electrode have different shapes.

24. The nitride based semiconductor laser device according to claim 22, wherein said first ohmic electrode and said second ohmic electrode have the same shape.

25. The nitride based semiconductor laser device according to claim 22, wherein said transparent substrate is composed of gallium nitride or silicon carbide.

26. The nitride based semiconductor laser device according to claim 22, wherein said nitride based semiconductor layer contains at least one of gallium, aluminum, indium, boron, and thallium.

27. The nitride based semiconductor laser device according to claim 22, wherein at least one of said first and second ohmic electrodes is asymmetric with respect to a line passing through a center point of said cavity length and vertical to the cavity length direction.

28. The nitride based semiconductor laser device according to claim 22, wherein said nitride based semiconductor layer has a striped current injection region, and said first and second ohmic electrodes respectively have regions opposite to said striped current injection region.

29. The nitride based semiconductor laser device according to claim 22, further comprising dielectric films respectively formed at a front facet and a rear facet of said cavity.

30. The nitride based semiconductor laser device according to claim 29, wherein said dielectric films respectively formed at the front facet and the rear facet of said cavity have different reflectances.

31. The nitride based semiconductor laser device according to claim 22, wherein said nitride based semiconductor layer comprises a cladding layer of a first conduction type, an active layer, and a cladding layer of a second conduction type.

* * * * *